United States Patent [19]
Nishiguchi et al.

[11] Patent Number: 4,904,012
[45] Date of Patent: Feb. 27, 1990

[54] SUCTION DEVICE

[75] Inventors: Masanori Nishiguchi; Takeshi Sekiguchi, both of Kanagawa, Japan

[73] Assignee: Sumitomo Electric Industries, Ltd., Osaka, Japan

[21] Appl. No.: 293,614

[22] Filed: Jan. 5, 1989

Related U.S. Application Data

[63] Continuation of Ser. No. 123,788, Nov. 23, 1987, abandoned.

[30] Foreign Application Priority Data

Nov. 26, 1986 [JP] Japan ................................. 61-181596

[51] Int. Cl.$^4$ .............................................. B25J 15/06
[52] U.S. Cl. ...................................... 294/64.1; 29/743
[58] Field of Search ............................. 294/64.1–64.3; 29/740, 743; 269/21; 271/90; 279/3

[56] References Cited

U.S. PATENT DOCUMENTS

| | | | |
|---|---|---|---|
| 1,302,028 | 4/1919 | Fuchs et al. | 294/64.1 |
| 2,916,059 | 12/1959 | Wong | 294/64.1 X |
| 3,224,106 | 12/1965 | Way | 294/64.1 X |
| 3,466,079 | 9/1969 | Mammel | 294/64.3 |
| 3,517,958 | 6/1970 | Boucher et al. | 294/64.1 |
| 3,523,706 | 8/1970 | Logue | 294/64.3 |
| 3,608,946 | 9/1971 | Erickson et al. | 294/64.1 |
| 4,050,729 | 9/1977 | Hutson | 294/64.1 |
| 4,618,178 | 10/1986 | Hutson et al. | 294/64.1 |
| 4,735,449 | 4/1988 | Kuma | 294/64.3 |

FOREIGN PATENT DOCUMENTS

| | | | |
|---|---|---|---|
| 2628488 | 1/1978 | Fed. Rep. of Germany | 294/64.1 |
| 2631502 | 1/1978 | Fed. Rep. of Germany | 294/64.1 |
| 33678 | 3/1979 | Japan | 294/64.1 |

Primary Examiner—Johnny D. Cherry
Attorney, Agent, or Firm—Cushman, Darby & Cushman

[57] ABSTRACT

Suction device for handling a semiconductor wafer comprises a handling section having a plurality of suction ports opened in the same plane as the surface of the wafer and located within an area smaller than that of the surface of the wafer, a pressure reduction device connected to the suction port, an opening acts to release negative pressure produced by the pressure reduction device when a finger is released therefrom, and a grip integrally coupled to the handling section.

5 Claims, 1 Drawing Sheet

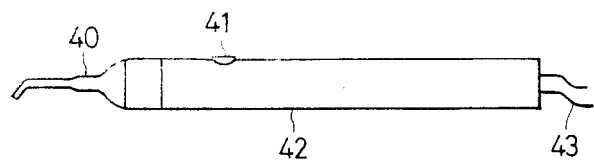
FIG. 1 PRIOR ART
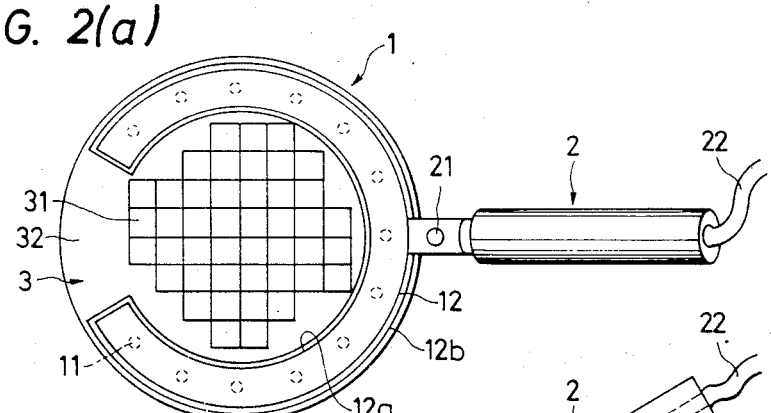
FIG. 2(a)
FIG. 2(b)
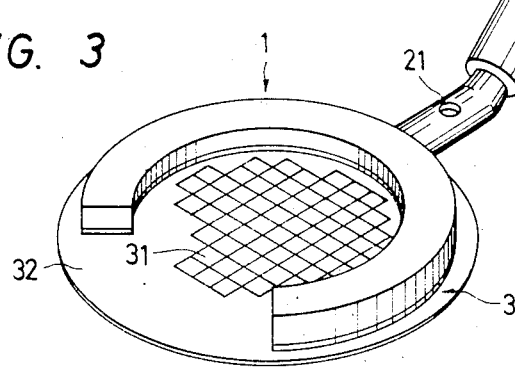
FIG. 3

SUCTION DEVICE

This is a continuation of application Ser. No. 7/123,788, filed Nov. 23, 1987.

BACKGROUND OF THE INVENTION

The present invention relates to a suction device for easily handling a semiconductor wafer which is required to be handled very carefully.

Conventionally, a semiconductor wafer is handled while being pinched on the front and back sides thereof with tweezers. However, the handling of the semiconductor wafer with the tweezers has problems mentioned below.

Namely, when the semiconductor wafer is pinched with the tweezers, stress is concentrated to the portion of the wafer which is in contact with the tweezers.

Since the semiconductor wafer such as a single crystal of silicon and a single crystal of gallium arsenide (GaAs) is a damageable material and has a very small thickness, the wafer is likely to crack from its portion in contact with the tips of the tweezers.

When the semiconductor wafer is pinched at about the center of gravity thereof, that is, at about the center of a flat-shaped wafer, with the tweezers in order to reduce the likelihood of cracking or damaging of the wafer, the processed region of the wafer is likely to be damaged by the tips of the tweezers.

Since the stress against the semiconductor wafer concentrates to its very small portion where the tweezers contacts the wafer in the pinching of the wafer with the tweezers, it is necessary to be very careful in handling the wafer. However, the wafer is still likely damaged in the handling thereof with the tweezers even if the wafer is very carefully handled.

If the tips of the tweezers are coated with a soft material for protecting the semiconductor wafer from damage, the tips of the tweezers are made so thick and round as to deteriorate the operating property of the tweezers for picking up the semiconductor wafer which is, for example, put on a flat rest.

For a Si chip, vacuum tweezers are conventionally used. FIG. 1 shows such a conventional vacuum tweezers. A nozzle 40 is attached to the tip of a grip 42. The air in the inside of the grip is exhausted through a hose 43 connected to a vacuum pump (not shown). When the nozzle 40 is made to contact with a chip and a hole 41 is closed by an operator's finger, the chip is absorbed to the nozzle. When the finger is released from the hole, the chip is separated from the nozzle.

However, since the nozzle of the conventional vacuum tweezers has only one through hole, a comparatively large stress is applied to the chip at its small portion where the vacuum tweezers contact with the chip. Although the conventional vacuum tweezers are originally intended to be used for the handling of the chip, they are applicable for a Si wafer in some cases. Since a Si wafer is less brittle and generally thicker than a GaAs wafer, the conventional vacuum tweezers are applicable for the Si wafer. However, they have not been used for a GaAs wafer.

SUMMARY OF THE INVENTION

It is an object of the present invention to provide a device by which the above-mentioned problems are solved to easily and safely handle a semiconductor wafer.

The suction device provided in accordance with the present invention comprises a handling section having a plurality of suction ports opened in the same plane as the surface of the handled semiconductor wafer and located within an area smaller than the surface of the wafer; a pressure reduction means connected to the suction port; a means for releasing negative pressure produced by the pressure reduction means; and a grip integrally coupled to the handling section.

Since a plurality of suction ports are provided in the handling section, the vacuum tweezers of the present invention have the advantage that the force for sucking the semiconductor wafer is divided.

The handling section of the suction device has the suction ports in the suction side thereof, which face the surface of the semiconductor wafer. The negative pressure is produced in each suction port by the pressure reduction means so that the semiconductor wafer is sucked to the handling section when the suction ports are brought into contact with the wafer.

Various kinds of means can be used as the pressure reduction means. Since a pressure reducer such as a vacuum pump is installed in many cases of handling of a semiconductor wafer, the negative pressure can be easily and stably produced by connecting the pressure reducer to the vacuum tweezers through a pressure-proof tube. Since the weight of the semiconductor wafer is small, a simple manual pump can be also used as the pressure reduction means and integrally coupled to the handling section.

The means for releasing the negative pressure can be made of an opening provided in a pressure reduction line and communicating with the atmosphere. When the semiconductor wafer is to be sucked to the vacuum tweezers, the opening is closed by a finger, for example. When the wafer is to be released from the suction device, the finger is separated from the opening to release the negative pressure. The means for releasing the negative pressure can thus be constituted easily.

Since only the suction ports of the suction device make contact with the unprocessed region or peripheral portion of the surface of the semiconductor wafer in a preferable embodiment of the present invention, the suction device never damages the processed region or central portion of the surface of the wafer.

Since the contact area of the semiconductor wafer with the handling portion of the suction device is much larger than that of a semiconductor water with conventional tweezers, the stress which is applied to every point of the wafer by the vacuum tweezers to support the wafer is much smaller than that applied by the conventional tweezers. Also, since the semiconductor wafer is sucked on the suction device by the negative pressure of a fluid, the stress applied to the wafer at one suction port is equal to the stress applied to the wafer at another suction port. These are desirable effects of the present invention, which can be further enhanced by increasing the number of the suction ports or extending the suction port as a slit along the total length of the contact portion between the handling section and the semiconductor wafer.

In a preferred embodiment of the present invention, an elastic member is provided on the portion of the handling section, which is brought into contact with the semiconductor wafer, so that the elastic member acts to efficiently suck the wafer to the suction device and protect the surface of the wafer from damage. The elastic member also serves as a sealing member between the wafer and the suction port of the suction device and reacts to the stress applied to the wafer due to the negative pressure. For that reason, it is desirable that the area of the contact of the elastic member with the wafer is made as large as possible.

Further, since the suction device only need to be moved downward to the semiconductor wafer when sucking the wafer, the suction device can be easily and safely operated even for the wafer placed on a flat rest. In view of this operation, the grip of the suction device has such a form as to make it easy to operate the suction device from the upper and side positions.

BRIEF DESCRIPTION OF THE DRAWINGS

FIG. 1 is a side view of a conventional suction device,

FIG. 2(a) is a plan view of suction device according to the present invention,

FIG. 2(b) is a side view of the suction device of FIG. 2(a), and

FIG. 3 is a perspective view of the suction device of FIG. 2(a).

BRIEF DESCRIPTION OF THE PREFERRED EMBODIMENT

An embodiment of the present invention is hereafter described in detail with reference to the drawings attached hereto. Since the embodiment is only an example, the present invention is not confined thereto.

FIG. 2(a) shows a plan view of suction device according to the embodiment of the present invention.

FIG. 2(b) shows a side view of the suction device of FIG. 2(a). FIG. 3 shows a perspective view of the suction device of FIG. 2(a) to enable better understanding. The same members or portions shown in these drawings are designated by the same reference symbols.

As shown in FIG. 2(a), the suction device are mainly composed of a handling section 1 which is C-shaped when being seen from the upper position, and a grip 2 extending outward from almost the center of the handling section. Since a semiconductor wafer 3, which is shown to be circular in FIG. 2(a), is normally notched in a portion thereof, the handling section 1 is made to be C-shaped. Although a plurality of independent negative pressure lines can be provided for the annular handling section 1 to cope with the form of the notched semiconductor wafer 3, the provision of a plurality of negative pressure lines results in complicating the constitution of the device. Therefore, it is not preferable to provide a plurality of independent negative pressure lines.

As shown in the drawings, the handling section 1 is hollow and has a plurality of openings 11 at the side which faces the semiconductor wafer 3. The openings 11 act as suction ports to suck the wafer 3 to the suction device.

As shown in FIG. 2(b), an elastic sealing member 12 is provided on the surface on which the suction openings 11 are provided, and covers the openings. The dimensions of the elastic sealing member 12 are determined so that the inner portion 12a (see FIG. 2(a)) of the sealing member is located outside the processed region 31 of the semiconductor wafer and the outer portion 12b of the sealing member 1 located inside the peripheral edge of the semiconductor wafer. The sealing member 12 is thus constructed to keep airtightness between the sucked wafer 3 and the suction openings 11 and not to damage the wafer.

The grip 2 has an opening 21 at the end of the grip, which is connected to the handling section 1. The opening 21 is located at the opposite side to the suction openings 11 of the handling section 1 and communicates with the internal cavity of the handling section. The other end of the grip 2 is connected to a flexible pressure-proof tube 22 coupled to a vacuum pump not shown in the drawings. The grip 2 is made slightly oblique upward from the handling section 1 to make it easy to horizontally put the handling section to the semiconductor wafer 3 placed in a horizontal position.

The operation of the suction device constructed as described above is now described. The vacuum pump is driven to produce negative pressure in the internal cavity of the suction device through the pressure-proof tube 22. The opening 21 of the grip 2 is then closed by a finger so that the negative pressure acts through the suction openings 11. The handling section 1 is moved down in a horizontal position to the semiconductor wafer 3 so that the wafer is sucked to the bottom of the handling section by the negative pressure. At that time, the sealing member 12 is located between the handling section 1 and the wafer 3 to keep airtightness between the handling section and the wafer. Therefore, the wafer 3 does not come off the handling section 1 as long as the negative pressure is maintained in the suction device.

Since the sealing member 12 is put into contact with only the unprocessed region of the wafer 3, the wafer is substantially not damaged.

After the semiconductor wafer 3 sucked on the vacuum tweezers as described above is lifted and moved to a desired position, the finger is separated from the opening 21 of the grip 2 to release the negative pressure in the suction device so that the internal pressure thereof approaches to the atmospheric level. As a result, the sucking force to the wafer 3 is lost so that the wafer is released from the handling section 1.

The suction device of the present invention was applied for GaAs wafers having the diameters of 2, 2, 3 and 3 inches and the thickness of 450, 200, 620 and 200 $\mu$m, respectively. The sucking force applied to the wafers was 6, 3, 20 and 7 gf, respectively. For the 3 inch wafer with 200 $\mu$m thickness, the sucking force of 5-10 gf may be applied, and the most preferable value is 7 gf. As a result, no damage was observed for any of GaAs wafers.

As described above, a fragile semiconductor wafer can be very easily handled with the suction device of the present invention provided in accordance with the present invention. The handling of the semiconductor wafer with the suction device is performed through such simple operation that a negative pressure release means is closed, a handling section is put to the top of the wafer, the wafer is sucked to the handling section, the tweezers and the wafer sucked thereto are moved together, and the negative pressure release means is opened to release the wafer from the tweezers.

The suction device of the present invention has have a very simple constitution and can be made of a material such as plastic which is easy to be acquired and processed.

In addition to the advantage of the simple operation of the suction device, further advantage. That is, the suction device is not brought into contact with the processed region of the semiconductor wafer, and the area of the surface of the suction device, which is brought into contact with the semiconductor wafer, is much larger than that of the surface of the conventional tweezers, so that the suction device does not damage or break the semiconductor wafer. Namely, the safety of the suction device of the present invention is extremely high as compared to of the conventional tweezers. Therefore, the use of the suction device of the present invention not only facilitates the handling of the semiconductor wafer but also enhances the yield thereof.

What is claimed is:

1. A suction device for handling a semiconductor wafer having a surface including a central processed region and a peripheral unprocessed region, said suction device comprising:

a handling section having upper and lower surfaces, a plurality of suction ports defined through said lower surface about an outer periphery of said lower surface so as to define a substantially arc-shaped suction port configuration, said handling section being sized and said suction ports being disposed so that when said lower surface of said handling section is placed in facing relation to and in operative contact with a surface of a semiconductor wafer, said suction ports are in facing relation to an unprocessed peripheral portion of the wafer and said handling section is free from operative contact with a processed portion of the semiconductor wafer;

a pressure reduction means operatively coupled to said suction ports for producing a negative pressure;

means for releasing said negative pressure produced by said pressure reduction means; and a grip element coupled to said handling section.

2. A suction device according to claim 1, in which an elastic member is provided on said handling section at the suction port surface thereof, said elastic member being hermetically interposed between said handling section and the surface of said semiconductor wafer when said semiconductor wafer is handled by said suction device, said elastic member maintaining said negative pressure produced by said pressure reduction means.

3. A suction device according to claim 1, in which said means for releasing the negative pressure is an opening provided in said grip element said opening communicating with a pressure reduction line between said suction ports and said pressure reduction means and having such a size that said opening can be closed by a finger.

4. A suction device according to claim 1, wherein said handling section is c-shaped in horizontal cross-section and sized so as to cover at least a portion of an unprocessed peripheral region of and so as to be free from contact with a central processed region of a semiconductor wafer when the semiconductor wafer is contacted by said handling section.

5. A suction device according to claims 1 wherein said grip element extends in such a direction as to increase the distance between said grip element and the suction port side of said handling section.

* * * * *